(12) United States Patent
Zhu et al.

(10) Patent No.: US 7,608,679 B2
(45) Date of Patent: Oct. 27, 2009

(54) ACENE-THIOPHENE COPOLYMERS

(75) Inventors: Peiwang Zhu, Woodbury, MN (US);
Tzu-Chen Lee, Woodbury, MN (US);
Dennis E. Vogel, Lake Elmo, MN (US);
Christopher P. Gerlach, Petaluma, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 600 days.

(21) Appl. No.: 11/278,222

(22) Filed: Mar. 31, 2006

(65) Prior Publication Data

US 2007/0232781 A1 Oct. 4, 2007

(51) Int. Cl.
C08G 75/00 (2006.01)
(52) U.S. Cl. .................................................... 528/373
(58) Field of Classification Search ................. 528/310, 528/373
See application file for complete search history.

(56) References Cited

U.S. PATENT DOCUMENTS

| 3,242,218 | A | 3/1966 | Miller |
| 3,250,808 | A | 5/1966 | Moore, Jr et al. |
| 3,274,239 | A | 9/1966 | Selman |
| 3,293,306 | A | 12/1966 | Le Bleu et al. |
| 3,322,826 | A | 5/1967 | Moore |
| 3,536,710 | A | 10/1970 | Bartlett |
| 3,544,537 | A | 12/1970 | Brace |
| 3,553,179 | A | 1/1971 | Bartlett |
| 3,810,874 | A | 5/1974 | Mitsch et al. |
| 3,864,318 | A | 2/1975 | Caporiccio et al. |
| 4,321,404 | A | 3/1982 | Williams et al. |
| 4,472,480 | A | 9/1984 | Olson |
| 4,567,073 | A | 1/1986 | Larson et al. |
| 4,647,413 | A | 3/1987 | Savu |
| 4,818,801 | A | 4/1989 | Rice et al. |
| 4,830,910 | A | 5/1989 | Larson |
| 5,306,758 | A | 4/1994 | Pellerite |
| 5,347,144 | A | 9/1994 | Garnier et al. |
| 5,362,919 | A | 11/1994 | Costello et al. |
| 5,454,880 | A | 10/1995 | Sariciftci et al. |
| 5,523,555 | A | 6/1996 | Friend et al. |
| 5,578,278 | A | 11/1996 | Fall et al. |
| 6,127,498 | A | 10/2000 | Tonelli et al. |
| 6,291,621 | B1 * | 9/2001 | Tan et al. ........................ 528/30 |
| 6,355,365 | B1 | 3/2002 | Hotta et al. |
| 6,359,149 | B1 | 3/2002 | Tan et al. |
| 6,433,359 | B1 | 8/2002 | Kelley et al. |
| 6,585,914 | B2 | 7/2003 | Marks et al. |
| 6,602,395 | B1 | 8/2003 | Zhuang et al. |
| 6,608,323 | B2 | 8/2003 | Marks et al. |
| 6,617,609 | B2 | 9/2003 | Kelley et al. |
| 6,690,029 | B1 | 2/2004 | Anthony et al. |
| 6,821,348 | B2 | 11/2004 | Baude et al. |
| 6,828,582 | B1 | 12/2004 | Ando et al. |
| 6,864,396 | B2 | 3/2005 | Smith et al. |
| 6,872,801 | B2 | 3/2005 | Ong et al. |
| 6,897,164 | B2 | 5/2005 | Baude et al. |
| 6,906,534 | B2 | 6/2005 | Hoisington et al. |
| 6,946,597 | B2 | 9/2005 | Sager et al. |
| 6,974,877 | B2 | 12/2005 | Vogel et al. |
| 6,998,068 | B2 | 2/2006 | Gerlach |
| 7,002,176 | B2 | 2/2006 | Iechi et al. |
| 7,030,409 | B2 | 4/2006 | Lee et al. |
| 7,049,629 | B2 | 5/2006 | Wu et al. |
| 7,385,221 | B1 | 6/2008 | Anthony et al. |
| 2002/0077450 | A1 * | 6/2002 | Kirchmeyer et al. ........ 528/373 |
| 2003/0102471 | A1 | 6/2003 | Kelley et al. |
| 2003/0151118 | A1 | 8/2003 | Baude et al. |
| 2004/0067387 | A1 | 4/2004 | Kim et al. |
| 2004/0104386 | A1 | 6/2004 | Wu et al. |

(Continued)

FOREIGN PATENT DOCUMENTS

JP 02-218716 8/1990

(Continued)

OTHER PUBLICATIONS

Anthony et al., "Functionalized Pentacene: Improved Electronic Properties from Control of Solid-State Order", *Am. Chem. Soc.*, 2001, 123. pp. 9482-9483.

(Continued)

*Primary Examiner*—Randy Gulakowski
*Assistant Examiner*—Shane Fang
(74) *Attorney, Agent, or Firm*—Jean A. Lown

(57) ABSTRACT

Acene-thiophene copolymers are provided that can be used as semiconductor materials in electronic devices. The acene-thiophene copolymers are of Formula I.

$$*\!-\!(\text{Ac}\!-\!\text{Q})_{n}\!-\!* \qquad \text{I}$$

In Formula I, Ac is a radical of an acene having 2 to 5 fused aromatic rings. The acene can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. Divalent group Q is selected from Formula III where

III each R1 and R2 group is independently selected from hydrogen, alkyl, alkoxy, thioalkyl, aryl, aralkyl, halo, haloalkyl, hydroxyalkyl, heteroalkyl, alkenyl, or combinations thereof. The subscript n in Formula I is an integer equal to at least 4. The asterisks in Formula I indicate the location of attachment to another group such as another repeat unit of formula —Ac-Q-.

20 Claims, No Drawings

U.S. PATENT DOCUMENTS

| | | |
|---|---|---|
| 2004/0119049 A1 | 6/2004 | Heeney et al. |
| 2004/0222412 A1 | 11/2004 | Bai et al. |
| 2005/0033263 A1 | 2/2005 | Gottlieb et al. |
| 2005/0035333 A1 | 2/2005 | Gerlach |
| 2005/0093031 A1 | 5/2005 | Akkerman et al. |
| 2006/0033086 A1 | 2/2006 | Gerlach |
| 2006/0102890 A1 | 5/2006 | Yamahara et al. |
| 2007/0102696 A1 | 5/2007 | Brown et al. |

FOREIGN PATENT DOCUMENTS

| | | |
|---|---|---|
| JP | 2001-151868 | 6/2001 |
| WO | WO 03/095445 A1 | 11/2003 |
| WO | WO 2005/055248 | 6/2005 |

OTHER PUBLICATIONS

Brabec, Christopher J., "Organic Photovoltaics: Technology and Market", *Solar Energy Materials and Solar Cells*, 2004, vol. 83, pp. 273-292.

Chan et al., "A Soluable Pentacene: Synthesis, EPR and Electrochemical Studies of 2,3,9,10-Tetrakis(Trimethylsily1)Pentacene", *Chem Commun.*, 2005, pp. 66-68.

Chen et al., "Regiocontrolled Synthesis of Poly(3-alkylthiophenes) Mediated by Rieke Zinc: Their Characterization and Solid-State Properties", *J. Am. Chem. Soc.*, 1995, 117, 233-244.

Clar et al., "The Nature of Para-Bond and of Para-Coupling", *Tetrahedron*, 28, 5049 (1972).

Comel, "Efficient One Pot Preparation of Variously Substituted Thieno[2,3-*b*]thiophene", *Journal of Heterocyclic Chemistry*, 2001 38, pp. 1167-1171.

Heeney et al., "Alkylidene Fluorene Liquid Crystalline Semiconducting Polymers for Organic Field Effect Transistor Devices", *Macromolecules*, 2004, 37, pp. 5250-5256.

Heeney, et al., "Stable Polythiophene Semiconductors Incorporating Thieno[2,3-b]thiophene", *J. Am. Chem. Soc.*, 2005, 127, pp. 1078-1079.

Hodge et al., "Synthesis of Poly(anthracene-2,6-diyl) and a Copolymer Containing Alternately Anthracene-2,6-diyl and *p*-phenylene Units", *Chem. Commun.*, 1997, pp. 73-74.

Ito et al., "Oligo(2,6-anthrylene)s: Acene-Oligomer Approach for Organic Field-Effect Transistors", *Angew. Chem., Int. Ed.*, 42, pp. 1159-1162 (2003).

Katz et al., "Synthetic Chemistry for Ultrapure, Processable, and High-Mobility Organic Transistor Semiconductors", *Acc. Chem. Res.*, vol. 34, pp. 359-369 (2001).

Laquindanum et al., "Synthesis, Morphology, and Field-Effect Mobility of Anthradithiophenes", *J. Am. Chem. Soc.*, 1998, vol. 120. pp. 664-672.

Loewe et al., "Regioregular, Head-to-Tail Coupled Poly(3-alkylthiophenes) Made Easy by the GRIM Method: Investigation of the Reaction and the Origin of Regioselectivity", *Macromolecules*, 2001, 34, pp. 4324-4333.

McCulloch et al., "Influence of Molecular Design on the Field-Effect Transistor Characteristics of Terthiophene Polymers", *Chem Mater.*, 2005, vol. 17, pp. 1381-1385.

McCullough et al., "Design, Synthesis, and Control of Conducting Polymer Architectures: Structurally Homogeneous Poly(3-alkylthiophenes)", *J. Org. Chem*, 1993, 58, pp. 904-912.

Meng et al., "High-Performance, Stable Organic Thin-Film Field-Effect Transistors Based on Bis-5'-alkylthiophen-2'-yl-2,6-anthracene Semiconductors", *J. Am. Chem. Soc.*, 2005, 127, pp. 2406-2407.

Miller et al., "Synthesis of β-Methoxy, Methyl-Capped α-Oligothiophenes", *J. Org. Chem.*, 60, pp. 6813-6819 (1995).

Musick et al., "Synthesis of Binaphthyl-Oligothiophene Copolymers With Emissions of Different Colors: Systematically Tuning the Photoluminescence of Conjugated Polymers", *Macromolecules*, 1998, vol. 31, pp. 2933-2942.

Nielson et al., "Structure-Property Relations of Regiosymmetrical 3,4-Dioxy-Functionalized Polythiophenes", *Macromolecules*, 2005, 38, 10379-10387.

Portnoy, J., "Fluorinated Acylthiophenes. Preparation of 5,5'-Diheptafluorobutyryl-2,2'-bithiophene *via* a Grignard Coupling Reaction", *Org. Chem*, 1967, vol. 32, pp. 233-234.

Rajca et al., Synthesis and Structure of Tetrathiophene With A Chiral 1,1'-binaphthyl Kink:, *Chem. Commun*, 2001, pp. 1060-1061.

Ried et al., *Angewante Chemie*, 1953, vol. 65, pp. 601.

Ruiz et al., "Repeat Unit Symmetry Effects on the Physical and Electronic Properties of Processable, Electrically Conducting, Substituted Poly (1,4-bis(2-thienyl)phenylenes)", *Macromolecules*, 1992, vol. 25, pp. 849-860.

Savu, Patricia M., "Fluoronated Higher Carboxylic Acids", *11 Kirk-Othmer Encyclopedia of Chemical Technology*, pp. 551-558, (4th Edition 1994).

Sheraw et al., "Spin-on Polymer Gate Dielectric for High Performance Organic Thin Film Transistors", *Materials Research Symposium Proceedings*, 2000, vol. 558, pp. 403-408.

Sirringhaus et al., "Mobility Enhancement in Conjugated Polymer Field-Effect Transistors Through Chain Alignment in a Liquid-Crystalline Phase", *Appl. Phys. Lett.*, 2000, vol. 77 No. 3, pp. 406-408.

Sirringhaus et al., "High-Resolution Inkjet Printing of All-Polymer Transistor Circuits", *Science*, 2000, vol. 290, pp. 2123-2126.

Sotzing et al., "Electrochromic Conducting Polymers via Electrochemical Polymerization of Bis(2-(3,4-ethylenedioxy)thienyl) Monomers", *Chem. Mater.*, 8, pp. 882-889 (1996).

Spanggaard et al., A Brief History of the Development of Organic and Polymeric Photovoltaics, *Solar Energy Materials and Solar Cells*, 2004, vol. 83, pp. 125-146.

Stokes et al., "New Phosphonic Acid Functionalized, Regioregular Polythiophenes", *Macromolecules*, 2003, 36, pp. 7114-7118.

Veres et al., "Air Stable, Amorphous Organic Films and their Applications to Solution Processable Flexible Electronics", *Mater. Res. Soc. Symp. Proc.*, 2002, vol. 708.

Veres et al., "Low-$k$ Insulators as the Choice of Dielectrics in Organic Field-Effect Transistors", *Adv. Funct. Mater.*, 2003, 13, pp. 199-204.

Veres et al., "Gate Insulators in Organic Field-Effect Transistors", *Chem. Mater.*, 2004, 16, pp. 4543-4555.

Vidal et al., "η-Conjugated Ligand Polymers Entwined Around Copper Centres", *Chem. Eur. J.*, 2000, 6, pp. 1663-1673.

Wei et al., "Synthesis and Electronic Properties of Aldehyde End-Capped Thiophene Oligomers and Other α,ω-Substituted Sexithiophenes", *Chem. Mater.*, 1996, vol. 8, pp. 2659-2666.

Wurthner et al., "Synthesis and Energy Transfer Properties of Terminally Substituted Oligothiophenes", *J. Am. Chem. Soc.*, 1995, vol. 117, pp. 8090-8099.

Zhai et al., "A Simple Method to Generate Side-Chain Derivatives of Regioregular Polythiophene via the GRIM Metathesis and Post-polymerization Functionalization", *Macromolecules*, 2003, 36, pp. 61-64.

Zhang et al., "Alkyl-Substituted Thieno[3,2-*b*]thiophene and Their Dimeric Subunits", *Macromolecules*, 2004, 37, pp. 6306-6315.

Zhu et al., "Conducting Polymetallorotaxanes: Metal Ion Mediated Enhancements in Conductivity and Charge Localization", *J. Am. Chem Soc.*, 1997, vol. 119, pp. 12568-12577.

Zhu et al., "Phenoxazine-Based Conjugated Polymers: A New Class of Organic Semiconductors for Field-Effect Transistors", *Macromolecules*, 2005, vol. 38, pp. 7983-7991.

U.S. Application entitled "6,13-Bis(thienyl)pentacene Componds", filed on Jul. 29, 2005, having U.S. Appl. No. 11/192,950.

U.S. Application entitled "Perfluoroether Acyl Oligothiophene Compounds", filed on Mar. 9, 2005, having U.S. Appl. No. 11/076,268.

U.S. Application entitled "Bottom Gate Thin Film Transistors", filed on Dec. 28, 2005, having U.S. Appl. No. 11/275,367.

U.S. Application entitled "Electronic Devices Containing Acene-Thiophene Copolymers", filed Mar. 31, 2006, having U.S. Appl. No. 11/278,229.

U.S. Application entitled "Electronic Devices Containing Acene-Thiophene Copolymers With Silethynly Groups", filed Apr. 21, 2006, having U.S. Appl. No. 11/379,662.

U.S. Application entitled "Acene-Thiophene Copolymers With Silethynly Groups", filed Apr. 21, 2006, having U.S. Appl. No. 11/379,642.

Liu, Yunqi et al., "A Binaphthyl-Bithiophene Copolymer for Light-Emitting Devices", Macromolecular Chemistry and Physics (2002), 203, No. 1, pp. 37-40,.

\* cited by examiner

ACENE-THIOPHENE COPOLYMERS

TECHNICAL FIELD

Acene-thiophene copolymers are described.

BACKGROUND

Traditionally, inorganic materials have dominated the electronic device industry. For example, silicon arsenide and gallium arsenide have been used as semiconductor materials, silicon dioxide has been used as an insulator material, and metals such as aluminum and copper have been used as electrode materials. In recent years, however, there has been an increasing research effort aimed at using organic materials rather than the traditional inorganic materials in electronic devices. Among other benefits, the use of organic materials may enable lower cost manufacturing of electronic devices, may enable large area applications, and may enable the use of flexible circuit supports for display backplane and integrated circuits.

A variety of organic semiconductor materials have been considered, the most common being fused aromatic ring compounds as exemplified by small molecules such as pentacene-containing compounds, tetracene-containing compounds, anthracene-containing compounds, bis(acenyl)acetylene compounds, and acene-thiophene compounds. Several polymeric materials have also been considered such as regioregular polythiophenes such as poly(3-alkylthiophene) and polymers having fused thiophene units or bis-thiophene units. However, at least some of the polymers tend to undergo oxidation, which can lead to diminished device performance.

SUMMARY OF THE INVENTION

Copolymeric materials are provided that can be used in electronic devices. More specifically, acene-thiophene copolymers are described that can be used in one or more layers in electronic devices such as, for example, organic thin film transistors, light emitting diodes, and photovoltaic cells.

In one aspect, an acene-thiophene copolymer of Formula I is provided.

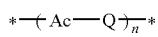

I

In Formula I, Ac is a radical of an acene having 2 to 5 fused aromatic rings. The acene is unsubstituted or substituted with a substituent selected from an alkyl, alkoxy, thioalkyl, aryl, aralkyl, halo, haloalkyl, hydroxyalkyl, heteroalkyl, alkenyl, or combinations thereof. Divalent group Q is selected from Formula II or III.

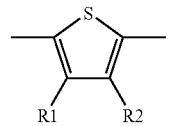

II

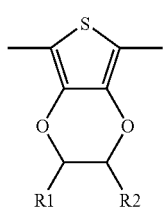

III

Each R1 and R2 group is independently selected from hydrogen, alkyl, alkoxy, thioalkyl, aryl, aralkyl, halo, haloalkyl, hydroxyalkyl, heteroalkyl, alkenyl, or combinations thereof. Subscript n is an integer equal to at least 4. The asterisks indicate the location of attachment to another group such as another repeat unit of formula

In another aspect, a composition is provided that includes a solvent and an acene-thiophene copolymer of Formula I.

The above summary of the present invention is not intended to describe each disclosed embodiment or every implementation of the present invention. The Detailed Description and Examples that follow more particularly exemplify these embodiments.

DETAILED DESCRIPTION OF THE INVENTION

The present invention provides acene-thiophene copolymers. The acene-thiophene copolymers can be included in one or more layers of electronic devices. For example, the acene-thiophene copolymers can be used as a semiconducting material in electronic devices such as organic thin film transistors or can be positioned between two electrodes in electronic devices such as an organic photovoltaic cell or an organic luminescent device.

As used herein, the terms "a", "an", and "the" are used interchangeably with "at least one" to mean one or more of the elements being described.

"Acene" refers to a polycyclic aromatic hydrocarbon group having at least 2 fused benzene rings in a rectilinear arrangement as shown by the following formula where m is an integer equal to or greater than zero.

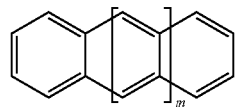

The acene usually has 2 to 5 fused benzene rings (i.e., naphthalene, anthracene, tetracene, and pentacene).

"Alkyl" refers to a monovalent group that is a radical of an alkane, which is a saturated hydrocarbon. The alkyl can be linear, branched, cyclic, or combinations thereof and typically contains 1 to 30 carbon atoms. In some embodiments, the alkyl group contains 4 to 30, 1 to 20, 4 to 20, 1 to 14, 1 to 10, 4 to 10, 4 to 8, 1 to 8, 1 to 6, or 1 to 4 carbon atoms. Examples of alkyl groups include, but are not limited to, methyl, ethyl, n-propyl, iso-propyl, n-butyl, tert-butyl, iso-butyl, n-pentyl, n-hexyl, cyclohexyl, n-octyl, n-heptyl, and ethylhexyl.

"Alkenyl" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include ethenyl, propenyl, and butenyl.

"Alkoxy" refers to a monovalent group of formula —OR where R is an alkyl group. Examples include, but are not limited to, methoxy, ethoxy, propoxy, and butoxy.

"Aryl" refers to a monovalent group that is a radical of an aromatic carbocyclic compound. The aryl can have one aromatic ring or can include up to 5 carbocyclic ring structures that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

"Aralkyl" refers to an alkyl substituted with an aryl group.

"Halo" refers to a halogen group (i.e., —F, —Cl, —Br, or —I).

"Haloalkyl" refers to an alkyl that is substituted with one or more halo groups.

"Hydroxyalkyl" refers to an alkyl that is substituted with one or more hydroxy groups.

"Heteroalkyl" refers to an alkyl having one or more —CH$_2$— groups replaced with a thio, oxy, or —NR$^a$— where R$^a$ is hydrogen or alkyl. The heteroalkyl can be linear, branched, cyclic, or combinations thereof and can include up to 30 carbon atoms and up to 20 heteroatoms. In some embodiments, the heteroalkyl includes up to 25 carbon atoms, up to 20 carbon atoms, up to 15 carbon atoms, or up to 10 carbon atoms. Thioalkyl groups and alkoxy groups are subsets of heteroalkyl groups.

"Thioalkyl" refers to a monovalent group of formula -SR where R is an alkyl group.

In one aspect, an acene-thiophene copolymer of Formula I is provided.

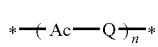

I

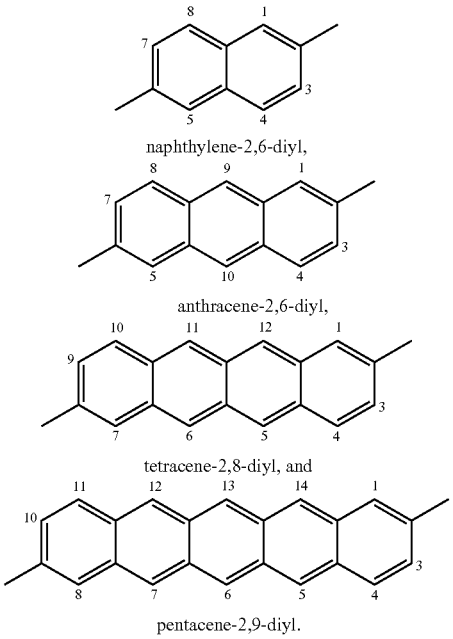

naphthylene-2,6-diyl, anthracene-2,6-diyl, tetracene-2,8-diyl, and pentacene-2,9-diyl.

In Formula I, Ac is a radical of an acene having 2 to 5 fused aromatic rings. The acene can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. Divalent group Q is selected from Formula II or III.

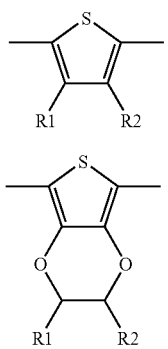

Each R1 and R2 group is independently selected from hydrogen, alkyl, alkoxy, thioalkyl, aryl, aralkyl, halo, haloalkyl, hydroxyalkyl, heteroalkyl, alkenyl, or combinations thereof. The subscript n is an integer equal to at least 4. The asterisks indicate the location of attachment to another group such as another repeat unit of formula —Ac-Q-.

The Ac group is a radical (e.g., a divalent radical) of an acene. The acene can have two to five fused rings arranged in a rectilinear manner (i.e., suitable acenes include naphthalene, anthracene, tetracene, and pentacene). Acenes are commonly given a numbering sequence in which each carbon atom that is a member of only one ring is numbered. Various positions of exemplary acene-diyls (i.e., divalent radicals of an acene) are shown in the following structures for Each Ac group can be unsubstituted or substituted with a substituent selected from an alkyl, alkoxy, thioalkyl, aryl, aralkyl, halo, haloalkyl, hydroxyalkyl, heteroalkyl, alkenyl, or combinations thereof. As used herein with reference to the Ac group, the term "substituent" refers to a group attached to Ac other than group Q, another repeat unit of formula —Ac-Q-, or an end group for the polymer. Likewise, the term "unsubstituted" means that Ac is free of a substituent. When referring to Ac substituents, the term "combinations thereof" can refer either to multiple substituents on the Ac group or to a first substituent that is further substituted with a second substituent. At least in some embodiments, the addition of one or more substituents tend to increase the solubility of the copolymer of Formula I in organic solvents or tends to improve the compatibility of the copolymer with various coating compositions.

Group Q can be attached to any position of Ac. The acene-thiophene copolymer of Formula I lacks any bithiophene or polythiophene group. That is, any two Ac groups are separated by a group Q selected from a single group of Formula II or III. In many embodiments, Q is attached to an outer aromatic ring of Ac. As used herein, the term "outer aromatic ring" refers to an aromatic ring of an acene that is fused to only one other aromatic ring. In some copolymers, group Q is attached to an outer aromatic ring of Ac such as at positions 1, 2, 3, 4, 5, 6, 7, or 8 for an Ac group based on naphthalene or anthracene, at positions 1, 2, 3, 4, 7, 8, 9, or 10 for an Ac group based on tetracene, or at positions 1, 2, 3, 4, 8, 9, 10, or 11 for an Ac group based on pentacene. In other embodiments, Q is attached to an inner aromatic ring of Ac. As used herein, the term "inner aromatic ring" refers to an aromatic ring of an acene that is fused to two other aromatic rings. In some copolymers, group Q is attached to an inner aromatic ring of Ac such as at positions 9 or 10 for an Ac group based on anthracene, at positions 5, 6, 11, or 12 for an Ac group based on tetracene, or at positions 5, 6, 7, 12, 13, or 14 for an Ac group based on pentacene.

In addition to being attached to group Q, the Ac group is attached to a second group such as another repeat unit of formula —Ac-Q- (i.e., the resulting copolymeric material has a subscript n equal to at least 5) or an end group of the polymer. If group Q in Formula I is attached to an inner aromatic ring of the Ac group, the second group is often attached to the same inner aromatic ring. If group Q is attached to an outer aromatic ring of the Ac group, the second group is often bonded to the opposite outer aromatic ring. That is, group Q and the second group are often attached to opposite distal ends of the Ac group. Exemplary Ac groups include, but are not limited to, naphthalene-2,6-diyl, naphthalene-2,7-diyl, anthracene-2,6-diyl, anthracene-2,7-diyl, anthracene-9,10-diyl, tetracene-2,8-diyl, tetracene-2,9-diyl, pentacene-2,9-diyl, pentacene-2,10-diyl, or pentacene-6,13-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof The position numbers indicate the carbon where the Q group and the second group are attached to the Ac group.

In some applications such as those in which the copolymers function as semiconductor materials, it may be desirable to select an Ac group that has an extended conjugation length in a linear direction. That is, in some applications, it is preferable that the Q group is attached to an outer aromatic ring of the acene. Exemplary Ac groups include, but are not limited to, naphthalene-2,6-diyl, anthracene-2,6-diyl, tetracene-2,8-diyl, or pentacene-2,9-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof. In some specific applications of the copolymers, the Ac group is anthracene-2,6-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

Group Q is selected from Formula II or III as described above. Each group R1 and R2 in these formulas is independently selected from hydrogen, alkyl, alkoxy, thioalkyl, aryl, aralkyl, halo, haloalkyl, hydroxyalkyl, heteroalkyl, alkenyl, or combinations thereof. When referring to groups R1 and R2, the term "combinations thereof" refers to a first group that is further substituted with another group.

In some embodiments of Formula I, there is at least one R1 group, R2 group, or Ac substituent that contains at least 4 carbon atoms such as 4 to 30 carbon atoms, 4 to 20 carbon atoms, 4 to 16 carbon atoms, or 4 to 10 carbon atoms. More specifically, there is at least one R1 group, R2 group, or Ac substituent selected from an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or combinations thereof. The selection of at least one such group can often increase the solubility of the acene-thiophene copolymer of Formula I in common organic solvents or can often improve the compatibility of the acene-thiophene copolymer with various coating compositions.

Some exemplary copolymers have only one groups selected from R1, R2, and the Ac substituent that contains at least 4 carbon atoms. Other exemplary copolymers have two groups selected from R1, R2, and the Ac substituent that contains at least 4 carbon atoms. In still other exemplary copolymers, all three of R1, R2, and the Ac substituent contain at least 4 carbon atoms. The groups that do not contain 4 carbon atoms can be hydrogen or can contain less than 4 carbon atoms.

If there is a single group selected from R1, R2, and the Ac substituent that has at least 4 carbon atoms but that group has less than 8 carbon atoms, the group is typically branched, cyclic, or combinations thereof. If there is a single group selected from R1, R2, and the Ac substituent that has at least 4 carbon atoms but that group has at least 8 carbon atoms, the group can be linear, branched, cyclic, or combinations thereof. If there are multiple groups selected from R1, R2, and the Ac substituent that have at least 4 carbon atoms, each group can independently be linear, branched, cyclic, or combinations thereof.

In some exemplary copolymers, at least one group selected from R1 or R2 has at least 4 carbon atoms (i.e, R1 has at least 4 carbon atoms, R2 has at least 4 carbon atoms, or both R1 and R2 have at least 4 carbon atoms). For example, R1 can be selected from hydrogen or a group that has less than 4 carbon atoms and R2 can be selected from an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof The Ac group can be unsubstituted or substituted in these exemplary copolymers.

In other exemplary copolymers, both R1 and R2 independently are an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof In some of these exemplary copolymers, R1 is identical to R2. The Ac group can be unsubstituted or substituted in these exemplary copolymers.

In still other exemplary copolymers, both R1 and R2 are hydrogen or have less than 4 carbon atoms and the acene has at least one substituent that has 4 carbon atoms. That is, at least one Ac substituent is an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof Exemplary linear alkyl groups having at least 8 carbon atoms include, but are not limited to, n-octyl, n-decyl, tetradecyl, hexadecyl, and the like. Exemplary alkyl groups having at least 4 carbon atoms that are branched, cyclic, or combinations thereof include, but are not limited to, sec-butyl, 2,2-dimethylpropyl, 3,5,5-trimethylhexyl, 2,3-dimethylpentyl, 2-ethylhexyl, 2-methylpentyl, 3-methylbutyl, 3-methylpentyl, 2-ethyl-3-methylbutyl, 2-(3,3-dimethylcyclohexyl)ethyl, and 2,5,7,7-tetramethyloctyl. These alkyl groups can be part of other groups such as alkoxy, thioalkyl, aralkyl, haloalkyl, hydroxyalkyl, or heteroalkyl groups. Specific branched heteroalkyl groups include, but are not limited to, 3,7-dimethyl-7-methoxyoctyl and 3-methylmercaptobutyl. Specific branched aralkyl groups include, but are not limited to, 2-methyl-4-phenylpentyl.

Exemplary linear alkenyl groups having at least 8 carbon atoms include, but are not limited to, cis-11-hexadecenyl, cis-4-heptadecenyl, cis-13-octadecenyl, cis-9-hexadecenyl, cis-8-undecenyl, cis-7-decenyl, cis-3-nonenyl, cis-6-nonenyl, and (E,Z)-2,6-dodecadienyl. Exemplary alkenyl groups having at least 4 carbon atoms that are branched, cyclic, or combinations thereof include, but are not limited to, 2-methy-4-(2,6,6-trimethyl-2-cyclohexenyl)-3-butenyl, 2-(2,2,3-trimethyl-3-cyclopentenyl)ethyl, 2-(2,6,6-trimethyl-1-cyclohexenyl)ethyl, 2-(2,2,3-trimethyl-3-cyclopentenyl)ethyl, 1,2,3,4,5,6,7,8-octahydro-8,8-dimethyl-2-naphthyl, 3,7-dimethyl-6-octenyl, 2,6-dimethyl-5-heptenyl, and 2-methyl-4-(2,6,6-trimethyl-1-cyclohexenyl)butyl.

The copolymers of Formula I can be prepared using Suzuki coupling reactions such as shown in Reaction Scheme A.

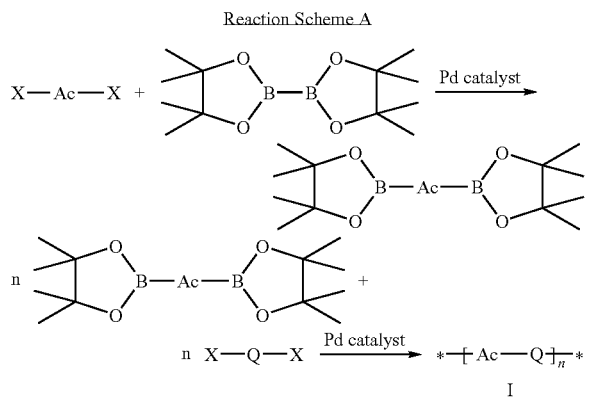

A dihaloacene is initially reacted with a dioxaborolane such as bis(pinacolato)diboron to form an acene compound having two dioxaborolane groups (e.g., tetramethyldioxaborolane). The acene compound with two dioxaborolane groups is then reacted with a dihalothiophene compound. The halo groups in the second reaction can be the same or different than the halo groups in the first reaction. Both of these reactions typically take place in the presence of a palladium catalyst such as, for example, tetrakis(triphenyl)phosphine)palladium(0). As an alternative to Reaction Scheme A, a dihalothiophene compound can be initially reacted with a dioxaborolane and then reacted with a dihaloacene using Suzuki coupling reactions. Suzuki coupling reactions are further described in the article Ito et al., *Angew. Chem., Int. Ed.*, 42, 1159-1162 (2003).

Stille coupling reactions can also be used to synthesize the copolymers of Formula I as shown in Reaction Scheme B.

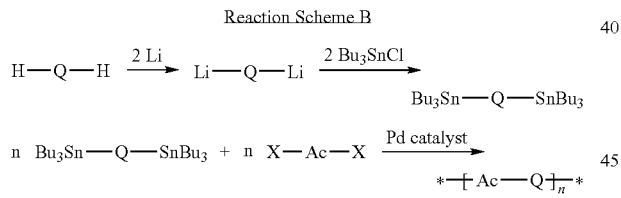

A thiophene compound can be lithiated and then reacted with a trialkylstannate such as tributyltin chloride to form a thiophene compound substituted with two trialkylstannate groups. The resulting thiophene compound can then be reacted with a dihaloacene in the presence of a palladium catalyst. As an alternative to Reaction Scheme B, an acene can be lithiated and then reacted with a trialkylstannate to form an acene substituted with two trialkylstannate groups. The resulting acene compound can then be reacted with a dihalothiophene in the presence of a palladium catalyst. Stille coupling reactions are further described in the articles Miller et al., *J. Org. Chem.*, 60, 6813-6819 (1995) and Katz et al., *Acc. Chem. Res.*, 34, 359-369 (2001).

Halogenated acenes (i.e., dihaloacenes) for use in either Suzuki or Stille coupling reactions are either commercially available or can be synthesized from commercially available materials. For example, 1,4-dibromonapthalene, 2,6-dibromonapthalene, 9,10-dibromoanthracene are available from either Alfa Aesar or Sigma Aldrich. 2,6-dibromoanthracene can be prepared from commercially available 2,6-diaminoanthraquinone (Sigma Aldrich) as described by Hodge et al, *Chem Comm.*, 73 (1997). 1,4-dichlorotetracene, 5,12-dichlorotetracene, 5,11-dibromotetracene, and 5,11-dichlorotetracene can be prepared as described in the article Clar et al, *Tetrahedron*, 28, 5049 (1972) and the references cited therein. Dihalopentacenes substituted in the 2,9 and 2,10 positions can be synthesized as shown in Reaction Scheme C. The reaction of a halobenzene with pyromellitic anhydride under typical Friedel-Crafts conditions (e.g., $AlCl_3$, which is a strong Lewis Acid) in an inert solvent or with halobenzene as solvent with heat gives the two isomeric bis(halobenzoyl) phthalic acids A and B. These isomers can be separated by fractional recrystallization, chromatography or by differences in solubility. Further reactions of the individual bis (halobenzoyl)phthalic acids A and B are carried on separately first by cyclization to the corresponding tetrones C and D using triflic acid followed by reduction to the desired pentacenes E and F with sodium borohydride and stannous chloride. The R3 groups below are hydrogen or substituent groups.

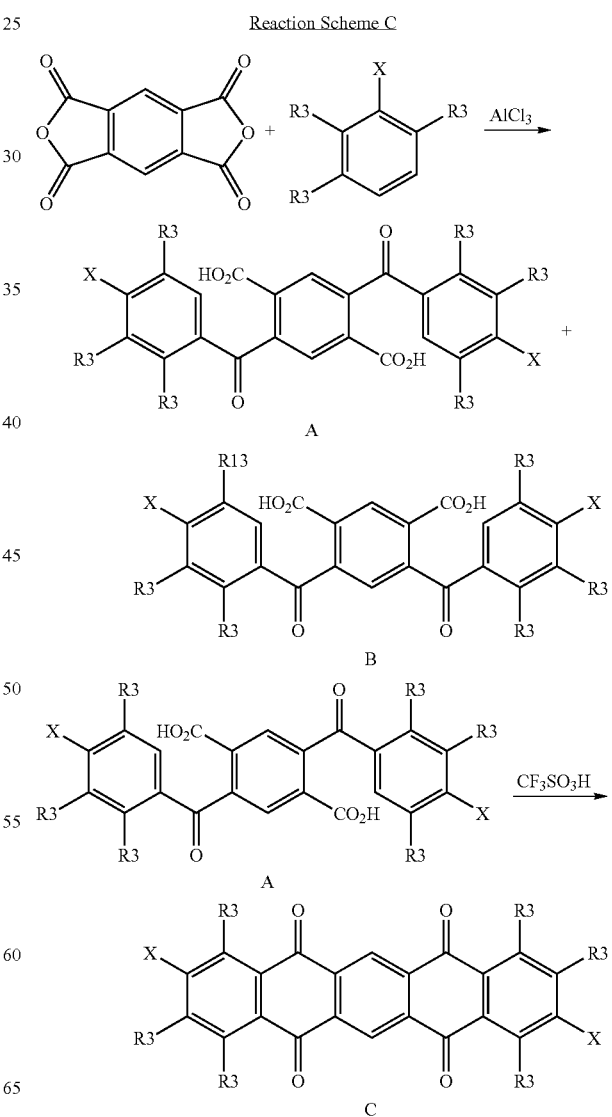

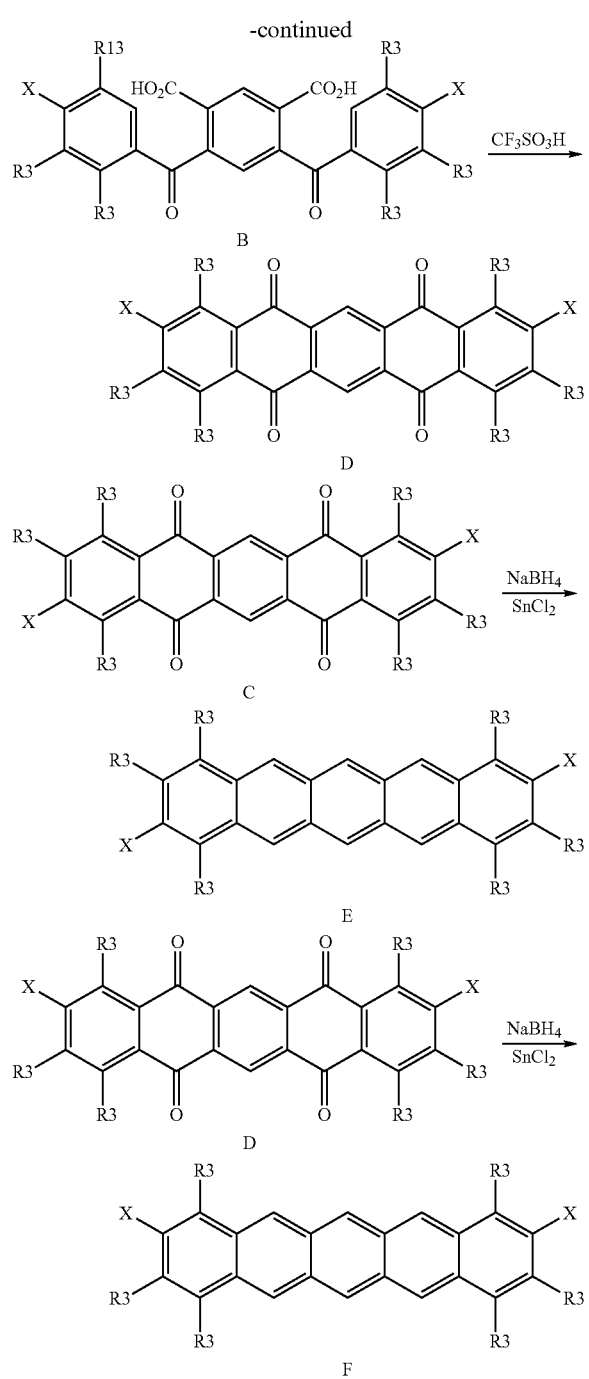

Dibromothiophene compounds of Formula IIa

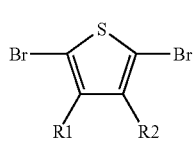

can be prepared by bromination of the corresponding thiophene compound. That is, the corresponding thiophene can be reacted with a brominating agent such as N-bromo- succinimide (NBS). For example, a compound of Formula IIa with R1 and R2 equal to alkyl groups can be prepared by reacting a 3,4-dihalothiophene with two moles of a Grignard reagent containing the desired alkyl groups followed by a bromination reaction. This method is further described in the article Vidal et al., *Chem. Eur. J.*, 6, 1663-1673 (2000).

Likewise, dihaloethylenedioxythiophene compounds of Formula IIIa

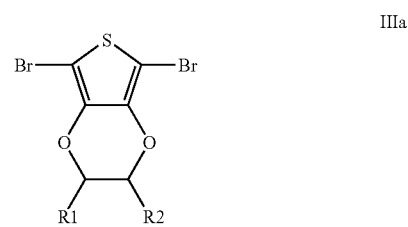

can be prepared by bromination of the corresponding ethylenedioxythiophenes. The corresponding ethylenedioxythiophenes can be prepared, for example, by transetherificative cyclocondensation of commercially available 3,4-dimethoxythiophenes with geminal diols such as 2,3-butanediol, 1,2-propanediol, and the like in the presence of an acid catalyst such as p-toluenesulfonic acid. The resulting 3,4-disubstituted thiophene can then be dibrominated at the 2 and 5 positions with N-bromosuccinimide or other suitable brominating agents. This method is further described in the article Nielson et al, *Macromolecules*, 38, 10379 (2005).

The copolymers of Formula I typically have a weight average molecular weight of at least 5,000 g/mole. In some embodiments, the weight average molecular weight is at least 7,000 g/mole, at least 8,000 g/mole, at least 10,000 g/mole, at least 12,000 g/mole or at least 15,000 g/mole. The weight average molecular weight can be determined using Gel Permeation Chromatography.

If desired, the purity of the copolymeric material can be increased using techniques known in the art such as additional precipitation steps or Soxhlet extraction.

In another aspect, a composition is provided that includes a solvent and an acene-thiophene copolymer of Formula I. Suitable solvents include, but are not limited to, aromatic solvents such as toluene, benzene, and xylene; ethers such as tetrahydrofuran and dioxane; ketones such as methyl isobutyl ketone and methyl ethyl ketone; chlorinated solvents such as chloroform, dichloromethane, chlorobenzene, and dichlorobenzene; alkanes such as cyclohexane and heptane; and amides such as N,N-dimethylformamide and 1-methylpyrrolidone. At least some of the acene-thiophene copolymers of Formula I are soluble in these solvents. As used herein, the term "soluble" means the copolymer can be dissolved in a solvent to provide a solution that contains at least 0.05 weight percent copolymer based on the weight of the solution. Some copolymers have a solubility of at least 0.05 weight percent, at least 0.1 weight percent, at least 0.2 weight percent, at least 0.5 weight percent, at least 1 weight percent, at least 2 weight percent, at least 3 weight percent, or at least 5 weight percent based on the weight of the solution.

The compositions can be used to provide a coating by application of the compositions to a surface such as to the surface of a substrate or to a surface of a layer in an electronic device. The coating can be applied using any suitable application technique such as, for example, spray coating, spin coating, dip coating, knife coating, gravure coating, inkjet printing, and transfer printing. The solvent can be removed from the coating after application by evaporating under ambient conditions (e.g., at about 20° C. to about 25° C.) or by drying at an elevated temperatures such as a temperature up to about 200° C., up to about 150° C., up to about 120° C., up to about 100° C., or up to about 80° C. In contrast, many other known organic semiconductor materials such as pentacene need to be vacuum deposited.

The acene-thiophene copolymers and solutions containing these copolymers tend to be stable for at least several days without special atmospheric protection and without special protection from light. In contrast, polythiophenes are not stable in solution and/or when exposed to air.

The foregoing describes the invention in terms of embodiments foreseen by the inventors for which an enabling description was available, notwithstanding that insubstantial modifications of the invention, not presently foreseen, may nonetheless represent equivalents thereto.

EXAMPLES

All reagents were purchased from commercial sources and used without further purification unless otherwise noted. Sodium carbonate was obtained from Sigma Aldrich (Milwaukee, Wis.); ALIQUAT 336, a phase transfer catalyst, was obtained from Alfa Aesar (Ward Hill, Mass.); and tetrakis (triphenylphosphine)palladium(0) was obtained from Sigma Aldrich (Milwaukee, Wis.). The following starting materials were prepared using published procedures as follows:

2,6-dibromoanthracene was prepared from commercially available 2,6-diaminoanthraquinone (Sigma Aldrich) as described by Hodge et al, *Chem Comma,* 73 (1997). The 2,6-dibromoanthracene was further purified by recrystallization from DMF.

2,6-di(4,4,5,5-tetramethyl-1,3,2-dioxaborolan-2-yl)anthracene was prepared from 2,6-dibromoanthracene according to the procedure published in the supporting information related to Meng et al., *J. Am. Chem. Soc.,* 127, 2406-2407 (2005). 2,5-dibromo-3,4-dihexylthiophene was prepared according to the procedure published in Vidal et al, *Chem. Eur. J.,* 6, 1663-1673 (2000).

2,5-Dibromo-3,4-ethylenedioxythiophene was prepared according to the procedure published in Sotzing et al., *Chem. Mater.,* 8, 882-889 (1996).

Preparatory Example 1

Preparation of 2,5-bis(4-chlorobenzoyl)terephthalic acid

A mixture of 497.6 grams (3.732 moles, 4.2 eq) of aluminum chloride, 2000 grams (17.77 moles, 20 eq) of chlorobenzene, and 193.8 grams (0.8885 moles, 1 eq) of benzene-1,2,4,5-tetracarboxylic acid dianhydride (pyromellitic dianhydride) was stirred and heat to 65° C. for 3 hrs. The mixture was cooled to room temperature while stirring overnight. This mixture was slowly added to a mixture of 1048 grams of 12M hydrochloric acid and stirred for one hour. Six liters of water was added and the organic layer was separated. The organic layer was washed with water until the water layer had a pH of greater than 1. To the organic layer was added 1429 mL of ethyl acetate, and 400 mL THF and the aqueous phase was separated and the organic phase was washed with 500 mL saturated NaCl and split. The organic phase was dried with magnesium sulfate and the solvent removed in vacuum to give 287.9 grams. This material was heated with three liters of ethyl acetate at 75° C. for five hours and then cooled. The solid was collected and air dried to give 95.73 grams of the desired product. $^1$H NMR (400 MHz, DMSO-$d_6$): δ7.951 (s, 2H), 7.748 (d, J=8.60 Hz, 4H), 7.58 (d, J=8.60 Hz, 4H).

Preparatory Example 2

Preparation of 2,9-dichloropentacene-5,7,12,14-tetrone

To 50 grams of 2,5-bis(4-chlorobenzoyl)terephthalic acid was added 500 mLs of trifluoromethanesulfonic acid and 1.57 mLs of trifluoromethanesulfonic anhydride and the mixture was heated to 150° C. overnight. The mixture was cooled to room temperature and poured onto 1000 grams of ice. The mixture was stirred until the ice melted. The solid was collected and washed with five liters of water. The pH of the filtrate was 4.0. The solid was air dried overnight to give 46 grams of the desired product. IR 1684 $cm^{-1}$ and 1593 $cm^{-1}$. $^1$H NMR (TfOH as solvent, DMSO-$d_6$ external lock): δ 9.225 (s, 0.5H), 9.120 (s, 1H), 9.002 (s, 0.5H), 8.271 (dd, J=8.65 Hz, J=3.65 Hz, 2H), 8.204 (t, J=2.25 Hz, 2H), 7.817 (dd, J=8.60 Hz, J=2.00Hz, 2H).

Preparatory Example 3

Preparation of 2,9-dichloropentacene

A mixture of 2.0 grams (5.9 mmol, 1eq) of 2,9-dichloropentacene-5,7,12,14-tetrone and 3.0 g (322 mmol, 54 eq) of sodium borohydride in 46 mL of 2-methoxyethylether was stirred at 23° C. in a nitrogen atmosphere for 14 hours. To this reaction mixture was added 23 mL of methanol in a dropwise fashion to keep the reaction temperature below 50° C. A solution of 18 grams (96 mmol, 16 eq) of stannous chloride in 19.7 grams of water and 7.3 grams of 12M hydrochloric acid was added at such a rate as to keep the reaction temperature between 23° C. and 40° C. The mixture was stirred for an additional 30 minutes. The reaction mixture was filtered and the residue washed with 46 mL of 12M hydrochloric acid followed by 120 mL of acetone and 40 mL of THF. The solid was dried in air to give 0.95 grams of the desired product. IR KBr 1618 $cm^{-1}$, 906 $cm^{-1}$.

Preparatory Example 4

Preparation of 2,9-di(4,4,5,5-tetramethyl-1,3,2-dioxaborolan-2-yl)pentacene

A nitrogen flushed round bottom flask is charged with 2,9-dichloropentacene (22.4 g, 64,67 mmol), bis(pinacolato) diboron (41.06 g, 161.67 mmole), potassium acetate (25.90 g, 263,85 mmole), and [1,1'-bis(diphenylphosphino)ferrocene] dichloropalladium complex with dichloromethane (1:1), available from Alfa Aesar (1.64 g, 2.0 mmol). Dimethyl sulfoxide (DMSO, 300 ml) is then added and the mixture is bubbled with nitrogen for 15 minutes. After heating to 80° C. for 16 hours the reaction mixture is cooled to room temperature and poured into ice-water (600 ml). It is then extracted with methylene chloride (2×) and the combined organic layer is dried over anhydrous magnesium sulfate. The solvent is removed by rotary evaporation and the residue is purified several times by flash gel chromatography.

Example 1

Preparation of poly(3,4-dihexylthiophene-alt-2,6-anthracene) (1)

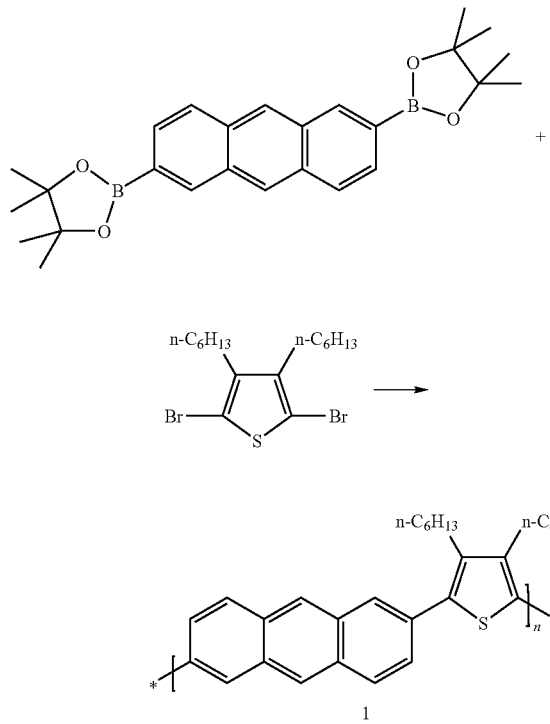

A 250 mL Schlenk flask was charged with 2,6-di(4,4,5,5-tetramethyl-1,3,2-dioxaborolan-2-yl)anthracene (2.631 g, 6.12 mmol), 2,5-dibromo-3,4-dihexylthiophene (2.544 g, 6.20 mmol), sodium carbonate (3.18 g, 30.0 mmol), ALIQUAT 336 (1.20 g), distilled water (15 mL), and toluene (100 mL). The mixture was degassed three times under a Schlenk line to remove oxygen. Tetrakis(triphenylphosphine)palladium(0) (0.150 g, 0.13 mmol) was then added under $N_2$ flow. After the mixture was degassed one more time, it was stirred under $N_2$ at 90° C. for 72 hours. A dark green precipitate appeared. The mixture was then cooled to 60° C. and the solid was removed by filtration. The toluene solution was separated from the filtrate and was washed with DI water until the water washes had a neutral pH. The toluene solution was then added dropwise to MeOH (500 mL) with vigorous stirring. A yellow precipitate appeared and was collected by filtration. The solid was re-dissolved in $CHCl_3$ (50 mL) and precipitated from MeOH (250 mL) twice and then washed with MeOH (via Soxhlet extraction) for 24 hours. A yellow solid (1.22 g, yield: 47%) was obtained as product. The number average molecular weight (Mn) was equal to 12000 g/mole and the weight average molecular weigh (Mw) was equal to 52000 g/mole. $^1$H NMR (400 MHz, $CDCl_3$): δ 8.20-8.53 ppm (br, 2H, ArH), 8.10-8.18 (br, 2H, ArH), 7.87-8.10 (br, 2H, ArH), 7.34-7.85 (br, 2H, ArH), 2.50-2.91 (br, 4H, $CH_2$), 1.49-1.84 (br, 4H, $CH_2$), 1.07-1.49 (br, 12H, $CH_2$), 0.67-0.97 (br, 6H, $CH_3$). TGA showed that the decomposition temperature was 455° C.

Example 2

Preparation of poly(3,4-ethylenedioxythiophene-alt-2,6-anthracene) (2)

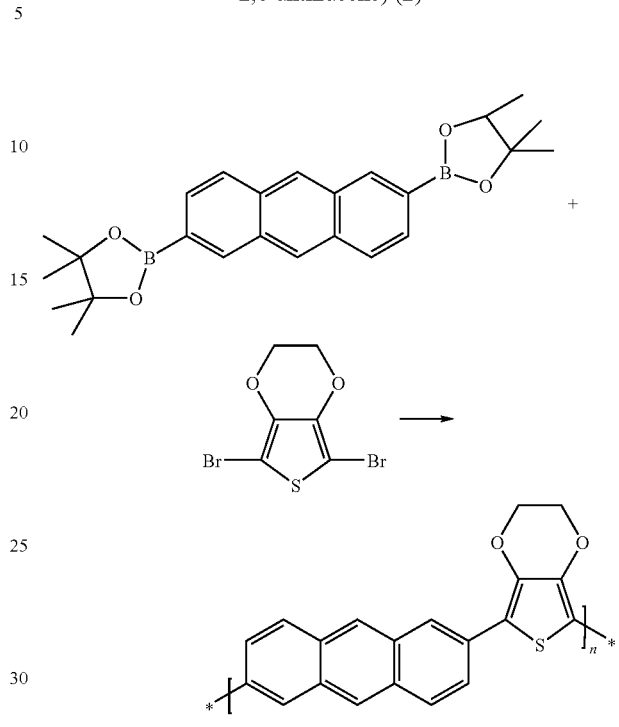

A 100 mL Schlenk flask was charged with 2,6-di(4,4,5,5-tetramethyl-1,3,2-dioxaborolan-2-yl)anthracene (0.430 g, 1.00 mmol), 2,5-dibromo-3,4-ethylenedioxythiophene (0.300 g, 1.00 mmol), sodium carbonate (0.530 g, 5.00 mmol), ALIQUAT 336 (0.24 g), distilled water (5 mL), and toluene (50 mL). The mixture was degassed three times under Schlenk line to remove oxygen. Tetrakis(triphenylphosphine) palladium(0) (0.025 g, 0.02 mmol) was then added under $N_2$ flow. After degassing one more time, the mixture was stirred under $N_2$ at 90° C. for 72 hours. A red precipitate appeared. After the mixture was cooled to room temperature, the solid was collected by filtration and washed with toluene and DI water. It was then washed with methanol (via Soxhlet extraction) 24 hours. Red solid (0.33 g, yield: approximately 100%) was obtained as product.

Example 3

Preparation of poly(3,4-ethylenedioxythiophene-alt-2,9-pentacene)

A 100 mL Schlenk flask is charged with 2,9-di(4,4,5,5-tetramethyl-1,3,2-dioxaborolan-2-yl)pentacene (0.530 g, 1.00 mmol), 2,5-dibromo-3,4-ethylenedioxythiophene (0.300 g, 1.00 mmol), sodium carbonate (0.530 g, 5.00 mmol), ALIQUAT 336 (0.24 g), distilled water (5 mL), and toluene (50 mL). The mixture is degassed three times under Schlenk line to remove oxygen. Tetrakis(triphenylphosphine) palladium(0) (0.025 g, 0.02 mmol) is then added under $N_2$ flow. After degassing one more time, the mixture is stirred under $N_2$ at 90° C. for 72 hours. After the mixture is cooled to room temperature, the solid is collected by filtration and washed with toluene and DI water. It is then washed with methanol (via Soxhlet extraction) 24 hours.

We claim:

1. A copolymer of Formula I

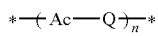

wherein
Ac is a radical of an acene having 2 to 5 fused aromatic rings, wherein Ac is unsubstituted or substituted with a substituent selected from an alkyl, alkoxy, thioalkyl, aryl, aralkyl, halo, haloalkyl, hydroxyalkyl, heteroalkyl, alkenyl, or combinations thereof;

Q is a divalent group of Formula III;

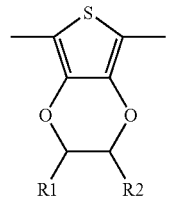

R1 and R2 are each independently selected from hydrogen, alkyl, alkoxy, thioalkyl, aryl, aralkyl, halo, haloalkyl, hydroxyalkyl, heteroalkyl, or alkenyl the asterisks indicate the location of attachment to another group such as another repeat unit of formula —Ac-Q-; and n is an integer greater than or equal to 4, wherein the compound of Formula I is a semiconductor material.

2. The copolymer of claim 1, wherein Ac is selected from naphthalene-2,6-diyl, naphthalene-2,7-diyl, anthracene-2,6-diyl, anthracene-2,7-diyl, anthracene-9,10-diyl, tetracene-2, 8-diyl, tetracene-2-9-diyl, pentacene-2,9-diyl, pentacene-2, 10-diyl, or pentacene-6,13-diyl, the Ac being unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

3. The copolymer of claim 1, wherein Ac is selected from naphthalene-2,6-diyl, anthracene-2,6-diyl, tetracene-2,8-diyl, or pentacene-2,9-diyl, the Ac being unsubstituted or substituted with a substituent selected from an alkyl, alkoxy, thioalkyl, aryl, aralkyl, halo, haloalkyl, hydroxyalkyl, heteroalkyl, alkenyl, or a combination thereof.

4. The copolymer of claim 1, wherein Ac is anthracene-2, 6-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

5. The copolymer of claim 1, wherein at least one of the R1 group, R2 group, or the Ac substituent has at least 4 carbon atoms.

6. The copolymer of claim 1, wherein R1 is hydrogen or has at least 4 carbon atoms and R2 has at least 4 carbon atoms.

7. The copolymer of claim 1, wherein both R1 and R2 have at least 4 carbon atoms.

8. The copolymer of claim 1, wherein both R1 and R2 are hydrogen or have less than 4 carbon atoms and the Ac substituent has at least 4 carbon atoms.

9. The copolymer of claim 1, wherein at least one of R1 or R2 is an alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof.

10. The copolymer of claim 1, wherein both R1 and R2 are independently selected from alkyl having at least 4 carbon atoms, an alkoxy having at least 4 carbon atoms, a thioalkyl having at least 4 carbon atoms, an aryl having at least 6 carbon atoms, an aralkyl having at least 10 carbon atoms, a haloalkyl having at least 4 carbon atoms, a hydroxyalkyl having at least 4 carbon atoms, a heteroalkyl having at least 4 carbon atoms, an alkenyl having at least 4 carbon atoms, or a combination thereof.

11. The copolymer of claim 1, wherein both R1 and R2 are independently an alkyl having at least 4 carbon atoms.

12. The copolymer of claim 1, wherein R1 and R2 are each independently hydrogen or an alkyl.

13. The copolymer of claim 1, wherein R1 and R2 are each hydrogen and Ac is anthracene-2,6-diyl that is unsubstituted or substituted with a substituent selected from an alkyl, alkoxy, thioalkyl, aryl, aralkyl, halo, haloalkyl, hydroxyalkyl, heteroalkyl, alkenyl, or combinations thereof.

14. A composition comprising a solvent and a compound of Formula I

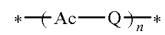

wherein
Ac is a radical of an acene having 2 to 5 fused aromatic rings, the acene being unsubstituted or substituted with a substituent selected from an alkyl, alkoxy, thioalkyl, aryl, aralkyl, halo, haloalkyl, hydroxyalkyl, heteroalkyl, alkenyl, or a combination thereof Q is a divalent group selected from a group of Formula III;

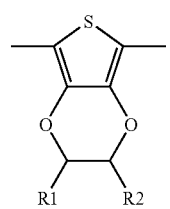

R1 and R2 are each independently selected from hydrogen, alkyl, alkoxy, thioalkyl, aryl, aralkyl, halo, haloalkyl, hydroxyalkyl, heteroalkyl, or alkenyl the asterisks indicate the location of attachment to another group such as another repeat unit of formula —Ac-Q-; and n is an integer greater than or equal to 4, wherein the compound of Formula I is a semiconductor material.

15. The composition of claim 14, wherein at least one of R1, R2, or the Ac substituent has at least 4 carbon atoms.

16. The composition of claim 14, wherein R1 is hydrogen or has less than 4 carbon atoms and R2 has at least 4 carbon atoms.

17. The composition of claim 14, wherein both R1 and R2 have at least 4 carbon atoms.

18. The composition of claim 14, wherein both R1 and R2 are hydrogen or have less than 4 carbon atoms and the Ac substituent has at least 4 carbon atoms.

19. The composition of claim 14, wherein at least two of R1, R2, and the Ac substituent have at least 4 carbon atoms.

20. The composition of claim 14, wherein the composition is a solution comprising at least 0.05 weight percent of the compound of Formula I based on the weight of the solution.

* * * * *

UNITED STATES PATENT AND TRADEMARK OFFICE
CERTIFICATE OF CORRECTION

PATENT NO. : 7,608,679 B2
APPLICATION NO. : 11/278222
DATED : October 27, 2009
INVENTOR(S) : Zhu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 776 days.

Signed and Sealed this

Twelfth Day of October, 2010

David J. Kappos
*Director of the United States Patent and Trademark Office*